United States Patent
Rivero et al.

(10) Patent No.: US 9,269,771 B2
(45) Date of Patent: Feb. 23, 2016

(54) INTEGRATED CIRCUIT COMPRISING COMPONENTS, FOR EXAMPLE NMOS TRANSISTORS, HAVING ACTIVE REGIONS WITH RELAXED COMPRESSIVE STRESSES

(71) Applicant: STMicroelectronics (Rousset) SAS, Rousset (FR)

(72) Inventors: Christian Rivero, Rousset (FR); Guilhem Bouton, Peynier (FR); Pascal Fornara, Pourrieres (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 14/627,281

(22) Filed: Feb. 20, 2015

(65) Prior Publication Data
US 2015/0249132 A1    Sep. 3, 2015

(30) Foreign Application Priority Data

Feb. 28, 2014   (FR) ...................................... 14 51616

(51) Int. Cl.
| | |
|---|---|
| *H01L 29/10* | (2006.01) |
| *H01L 29/06* | (2006.01) |
| *H01L 21/762* | (2006.01) |
| *H01L 21/763* | (2006.01) |
| *H01L 29/78* | (2006.01) |

(52) U.S. Cl.
CPC .......... *H01L 29/1083* (2013.01); *H01L 21/763* (2013.01); *H01L 21/76224* (2013.01); *H01L 29/0649* (2013.01); *H01L 29/7846* (2013.01)

(58) Field of Classification Search
None
See application file for complete search history.

(56) References Cited

U.S. PATENT DOCUMENTS

| | | | |
|---|---|---|---|
| 5,913,125 A * | 6/1999 | Brouillette | .......... B81C 1/00666 |
| | | | 257/E21.133 |
| 6,407,898 B1 | 6/2002 | Wu | |
| 7,755,163 B2 | 7/2010 | Ogawa | |
| 7,948,028 B2 | 5/2011 | Renn | |

(Continued)

FOREIGN PATENT DOCUMENTS

| | | |
|---|---|---|
| DE | 102011001527 A1 | 12/2011 |
| EP | 0764985 A2 | 3/1997 |

(Continued)

OTHER PUBLICATIONS

Gaetan Raymond: "Etude mecanique des films de nitrure de silicium fortementcontraints utilises pour augmenter les performances des transistors CMOS," Sep. 23, 2010, Extrait de l'Internet: URL: http://tel.archives-ouvertes.fr/docs/00/52/04/27/PDF/these_gaetan_Raymond.pdf, p. 9-p. 23.

(Continued)

*Primary Examiner* — Alexander Ghyka
(74) *Attorney, Agent, or Firm* — Gardere Wynne Sewell LLP (57) ABSTRACT

An integrated circuit includes a substrate and at least one component unfavorably sensitive to compressive stress which is arranged at least partially within an active region of the substrate limited by an insulating region. To address compressive stress in the active region, the circuit further includes at least one electrically inactive trench located at least in the insulating region and containing an internal area configured to reduce compressive stress in the active region. The internal area is filled with polysilicon. The polysilicon filled trench may further extend through the insulating region and into the substrate.

15 Claims, 10 Drawing Sheets

(56) References Cited

U.S. PATENT DOCUMENTS

| | | |
|---|---|---|
| 8,524,556 B1 | 9/2013 | Chiou et al. |
| 8,779,526 B2 | 7/2014 | Hsu et al. |
| 8,847,319 B2 | 9/2014 | Liu et al. |
| 2004/0022102 A1 | 2/2004 | Liang et al. |
| 2004/0099912 A1 | 5/2004 | Chow et al. |
| 2005/0139887 A1 | 6/2005 | Song |
| 2005/0151183 A1 | 7/2005 | Tu |
| 2005/0285137 A1 | 12/2005 | Satoh |
| 2006/0014340 A1 | 1/2006 | Matsumori |
| 2007/0090417 A1 | 4/2007 | Kudo |
| 2007/0117306 A1 | 5/2007 | Oyamatsu |
| 2007/0132032 A1 | 6/2007 | Teo et al. |
| 2007/0145522 A1 | 6/2007 | Oishi |
| 2008/0017929 A1 | 1/2008 | Yi |
| 2008/0036012 A1 | 2/2008 | Yang et al. |
| 2008/0054413 A1 | 3/2008 | Dyer et al. |
| 2008/0079097 A1 | 4/2008 | Inokuma |
| 2008/0122002 A1 | 5/2008 | Pei et al. |
| 2008/0179638 A1 | 7/2008 | Dyer et al. |
| 2009/0001466 A1 | 1/2009 | Yang et al. |
| 2009/0079000 A1 | 3/2009 | Yamazaki et al. |
| 2009/0108463 A1 | 4/2009 | Pidin |
| 2009/0206414 A1 | 8/2009 | Sudo |
| 2009/0230439 A1 | 9/2009 | Wang et al. |
| 2009/0294986 A1 | 12/2009 | Yan et al. |
| 2009/0309163 A1 | 12/2009 | Wang et al. |
| 2010/0001369 A1 | 1/2010 | Chuang et al. |
| 2010/0022061 A1 | 1/2010 | Wu et al. |
| 2010/0044802 A1 | 2/2010 | Ishibashi et al. |
| 2010/0059823 A1 | 3/2010 | Chung et al. |
| 2010/0156510 A1 | 6/2010 | Botula et al. |
| 2010/0270623 A1 | 10/2010 | Kirimura et al. |
| 2010/0320509 A1 | 12/2010 | Knorr et al. |
| 2011/0081765 A1 | 4/2011 | Cummings et al. |
| 2011/0260294 A1 | 10/2011 | Oh |
| 2011/0318897 A1 | 12/2011 | Shang et al. |
| 2012/0256266 A1 | 10/2012 | Itou et al. |
| 2012/0267759 A1 | 10/2012 | Shroff et al. |
| 2013/0015531 A1 | 1/2013 | Kim et al. |
| 2013/0062680 A1 | 3/2013 | Kato et al. |
| 2013/0087861 A1 | 4/2013 | Chen et al. |
| 2013/0105912 A1 | 5/2013 | Hsu et al. |
| 2013/0270650 A1 | 10/2013 | Tseng et al. |
| 2013/0277754 A1 | 10/2013 | Liang et al. |
| 2014/0051222 A1 | 2/2014 | Terahara et al. |
| 2014/0131771 A1 | 5/2014 | Flachowsky et al. |
| 2014/0138793 A1 | 5/2014 | Chidambaram et al. |
| 2015/0129987 A1 | 5/2015 | Jeng et al. |
| 2015/0255540 A1 | 9/2015 | Bouton et al. |

FOREIGN PATENT DOCUMENTS

| | | |
|---|---|---|
| EP | 1858067 A1 | 11/2007 |
| JP | 2004165378 A | 6/2004 |
| WO | WO-2004038800 A2 | 5/2004 |

OTHER PUBLICATIONS

INPI Search Report and Written Opinion for FR 1451616 dated Oct. 17, 2014 (13 pages).

* cited by examiner

INTEGRATED CIRCUIT COMPRISING COMPONENTS, FOR EXAMPLE NMOS TRANSISTORS, HAVING ACTIVE REGIONS WITH RELAXED COMPRESSIVE STRESSES

PRIORITY CLAIM

This application claims priority from French Application for Patent No. 1451616 filed Feb. 28, 2014, the disclosure of which is incorporated by reference.

TECHNICAL FIELD

The invention relates to integrated circuits, and more particularly to relaxation of the compressive stresses of an active region, for example that of an NMOS transistor.

BACKGROUND

In an integrated circuit, the transistors are produced in and on an active semiconductor region, for example of silicon, surrounded by an electrically insulating region, for example a trench filled, for example, with silicon dioxide.

Production of an MOS transistor within an insulating region inherently leads to an active region being obtained which is compressively stressed owing to the presence of the insulating region at its periphery. Furthermore, although a compressively stressed active region promotes the performance of a PMOS transistor, it conversely causes a degradation of the performance of an NMOS transistor, particularly in terms of mobility of the carriers.

Furthermore, the production of high-speed transistors requires small channel lengths and widths, and structures generally produced have a high density, which leads to active region dimensions which are very small or even minimal for the technology in question.

It is therefore extremely difficult or even impossible to increase the dimensions of the active regions of the NMOS transistors with a view to relaxing their compressive stresses, in view of the desired density of the structures produced.

SUMMARY

According to one embodiment, it is proposed to reduce the compressive stresses in the active region of a component unfavorably sensitive to compressive stresses, for example an NMOS transistor, or an active resistor, that is to say one formed in an active region, the resistive value of which may vary with the compressive stresses, and to do so without modifying the characteristics of the PMOS transistors.

A component unfavorably sensitive to compressive stresses is, in particular, a component of which at least one of its characteristics is modified in the presence of compressive stresses, leading to a degradation of its performance, as is the case for example for the mobility characteristic of an NMOS transistor.

One aspect provides an integrated circuit comprising a substrate and at least one component unfavorably sensitive to compressive stresses, for example an NMOS transistor, which is arranged at least partially within an active region of the substrate limited by an insulating region.

According to a general characteristic of this aspect, the integrated circuit comprises at least one electrically inactive trench located at least in the insulating region and containing an internal area configured in order to allow reduction of compressive stresses in the active region.

The active region of the substrate, within which the component is arranged, is an active region which is compressively stressed because of the presence of the insulating region. Specifically, in general, the material forming the insulating region, for example silicon dioxide, has a coefficient of thermal expansion much lower than that of the material forming the active region, typically silicon. For this reason, at the end of the method of fabricating the transistor, the insulating region is compressively stressed, thereby inducing compressive stresses in the active region.

Furthermore, the compressive stresses are reduced (these compressive stresses are relaxed) in the active zone by reducing the compressive stresses in the insulating region by virtue of the presence of the electrically inactive trench.

Moreover, since this trench is produced within the insulating region, its production is entirely transparent for the designer of the integrated circuit, since he simply determines the dimensions of the active region and of the insulating region without being preoccupied with the content of this insulating region, that is to say in the case in point the presence of an electrically inactive trench in this insulating region.

This is because this trench is mechanically active in order to allow reduction of the compressive stresses, but entirely electrically inactive, that is to say it is not connected to any other electrically active component or element of the integrated circuit, or to any potential.

The at least one trench is advantageously separate from a part of the substrate, and a plurality of embodiments are possible as regards the trench internal area configured in order to allow reduction of compressive stresses in the active region.

Thus, the trench may be filled partially with insulating material, for example silicon dioxide, in a nonconformal manner in order to leave an unfilled cavity remaining, which offers more free surface and allows relaxation of the stresses in the insulating region, and consequently in the active region.

According to another possible embodiment, the internal area may contain polycrystalline silicon, or polysilicon. This is because such a material, obtained after recrystallization of deposited amorphous silicon, is a material in tension, which further facilitates reduction of the compressive stresses in the insulating region, and consequently in the active region.

While the electrically insulating trench may be located only within the insulating region, it may according to one embodiment have an upper part located in the insulating region and extended by a lower part located in the substrate, the trench internal area configured in order to allow reduction of compressive stresses in the active region then being located in the upper part and in the lower part.

With such an embodiment, greater reduction of the compressive stresses is obtained.

When the internal area of the trench contains polycrystalline silicon, it is preferable for the lower part of the trench to comprise an electrically insulating layer, for example of silicon dioxide, arranged between the polycrystalline silicon and the substrate. This is because this makes it possible to avoid the occurrence of dislocations which could have occurred if the polycrystalline silicon were in direct contact with the silicon of the substrate, which is generally monocrystalline.

That edge of the trench which is located closest to an edge of the active region is advantageously separated from the edge of the active region by a distance at least equal to a minimum distance, so as in particular to comply with the design rules (Design Rules Manual) of the technology in question.

Since the trench formed in the insulating region is electrically inactive, it may partially or even fully surround the active region, even if the component is an NMOS transistor.

This is because the fact that the trench passes under the gate polysilicon of the transistor does not then create a parasitic transistor, and makes it possible to reduce the compressive stresses in the active region even further.

Furthermore, an additional insulating region is arranged above the component, the active region and the insulating region, and separates the component from the first metallization level of the integrated circuit. When this additional insulating region comprises an insulating lower layer (CESL layer (Contact Etch Stop Layer), for example) in compression, arranged above the component, the active region and the insulating region, this insulating lower layer in compression above the transistor and the insulating region also contributes to the presence of compressive stresses in the active region.

Furthermore, relaxation of compressive stresses of the active region may also be obtained by at least one electrically inactive protrusion arranged above at least a part of the trench and below the insulating lower layer in compression.

In other words, this protrusion locally raises the insulating lower layer in compression, which therefore makes it possible to relax compressive stresses in the active region.

This protrusion may comprise polycrystalline silicon.

Furthermore, when the component is an NMOS transistor, the protrusion advantageously has a structure similar to that of the gate region of the transistor.

This protrusion may at least partially surround the component, for example an active resistor.

This being the case, when the component is an NMOS transistor, the gate region of which has a part extending above the insulating region, this gate region part is at least at a minimum distance from the protrusion so as not to create a parasitic structure and so as to comply with the design rules (DRM) of the technology in question.

This protrusion, the location of which is defined on the "poly" mask, is mechanically active for relaxation of the stresses but electrically inactive, because it is not electrically connected.

Thus, the combination of a protrusion and an electrically inactive trench formed in the insulating region makes it possible to further reduce the compressive stresses in the active region of the component.

In order to reduce the compressive stresses even further, it is possible to stack an electrically inactive contact region above the protrusion, which is itself located at least partly above the electrically inactive trench.

Thus, according to such an embodiment, the integrated circuit furthermore comprises an electrically inactive contact region extending through the additional insulating region and coming in contact at least with the upper face of the protrusion, possibly even penetrating slightly into this protrusion, the at least one contact region being formed by at least one material different from the materials forming the insulating region and the additional insulating region; this material may be a metal, for example tungsten.

This being the case, in the event that it is not possible to provide a protrusion above the electrically inactive trench, according to another embodiment it may nevertheless be possible for the electrically inactive contact region to extend through the additional insulating region in order to come in contact at least with the upper face of a portion of the trench, and even slightly penetrate into this trench.

In fact, the Inventors have observed that the production of a contact extending through the additional insulating region, and in particular the insulating lower layer (known to the person skilled in the art by the acronym CESL: Contact Etch Stop Layer) of this additional insulating region, in order to come simply in contact with the insulating region, and even penetrate very slightly into this insulating region because of overetching, has also made it possible to relax the compressive stresses in the active region of the component. This is because the at least one material, for example a metal, forming this contact region is generally a material in tensile stress.

This contact region, which is for example metallic, the location of which is defined on the "contact" mask, is mechanically active for relaxation of the stresses but electrically inactive.

Thus, a component, for example an NMOS transistor, equipped with a trench and with at least one such metal contact region, has an active region which is even more relaxed in compressive stresses than in the absence of such a contact region.

It should furthermore be noted that the trench, or optionally the outline of the orthogonal projection onto the insulating region of the trench/protrusion stack or trench/contact region stack or trench/protrusion/contact region stack, remains advantageously contained laterally within the insulating region, that is to say the trench or optionally the stack does not extend laterally beyond this insulating region, in order to avoid overlap on an adjacent semiconductor body, which could cause static leakage currents.

When the integrated circuit comprises a group of a plurality of components unfavorably sensitive to compressive stresses, for example NMOS transistors, respectively arranged at least partially within a group of a plurality of active regions of the substrate, which are limited by the insulating region, the at least one electrically inactive trench may surround the group of active regions.

According to one embodiment, the integrated circuit may comprise a memory device comprising a memory plane having nonvolatile memory cells and selection transistors with buried gates, as well as a control unit of the memory plane, comprising in particular NMOS transistors forming the components unfavorably sensitive to compressive stresses; the at least one electrically inactive trench is then located in at least the insulating region limiting the active region of at least one of these NMOS transistors of the control unit and having a depth substantially equal to that of the buried gates.

Another aspect provides a method for fabricating at least one component unfavorably sensitive to compressive stresses, comprising production in a substrate of an integrated circuit and an insulating region limiting an active region of the substrate, and production of the component at least partially in the active region.

According to a general characteristic of this other aspect, the production of the insulating region comprises production of at least one electrically inactive trench located at least in the insulating region and containing an internal area configured in order to allow reduction of compressive stresses in the active region.

According to one embodiment, the production of the at least one electrically inactive trench comprises formation of an initial trench in at least one zone of the insulating region, and optionally in the substrate, and filling of the initial trench with polycrystalline silicon.

According to one embodiment, the method furthermore comprises production, above the component, the active region and the insulating region, of an additional insulating region comprising an insulating lower layer in compression, and production of at least one protrusion arranged above at least a part of the trench and below the insulating lower layer in compression.

According to one embodiment, the method furthermore comprises production of an electrically inactive contact region extending through the additional insulating region, this contact region being formed by at least one material different from the materials forming the insulating region and the additional insulating region. Furthermore, depending on the case, this contact region may come in contact at least with the upper face of the protrusion, and even slightly penetrate into this protrusion, or in the absence of a protrusion it may come in contact at least with the upper face of a portion of the electrically inactive trench, and even penetrate into this trench.

When the component is an NMOS transistor, the protrusion has a structure similar to that of the gate region of the transistor, and is advantageously produced simultaneously with the gate region.

When the at least one component unfavorably sensitive to compressive stresses is an NMOS transistor belonging to a control unit of a memory plane of an integrated memory device, the memory plane having nonvolatile memory cells and selection transistors with buried gates, the production of the at least one electrically inactive trench is advantageously carried out simultaneously with the production of the buried gates.

Likewise, the production of the at least one contact region may be carried out simultaneously with the production of the contacts on the source, drain and gate regions of the transistors of the memory devices.

BRIEF DESCRIPTION OF THE DRAWINGS

Other advantages and characteristics of the invention will become apparent on studying the detailed description of entirely nonlimiting embodiments, and the appended drawings, in which.

DETAILED DESCRIPTION OF THE DRAWINGS

Throughout what follows, the component unfavorably sensitive to compressive stresses is, for example, identified as an NMOS transistor.

Figure 1:
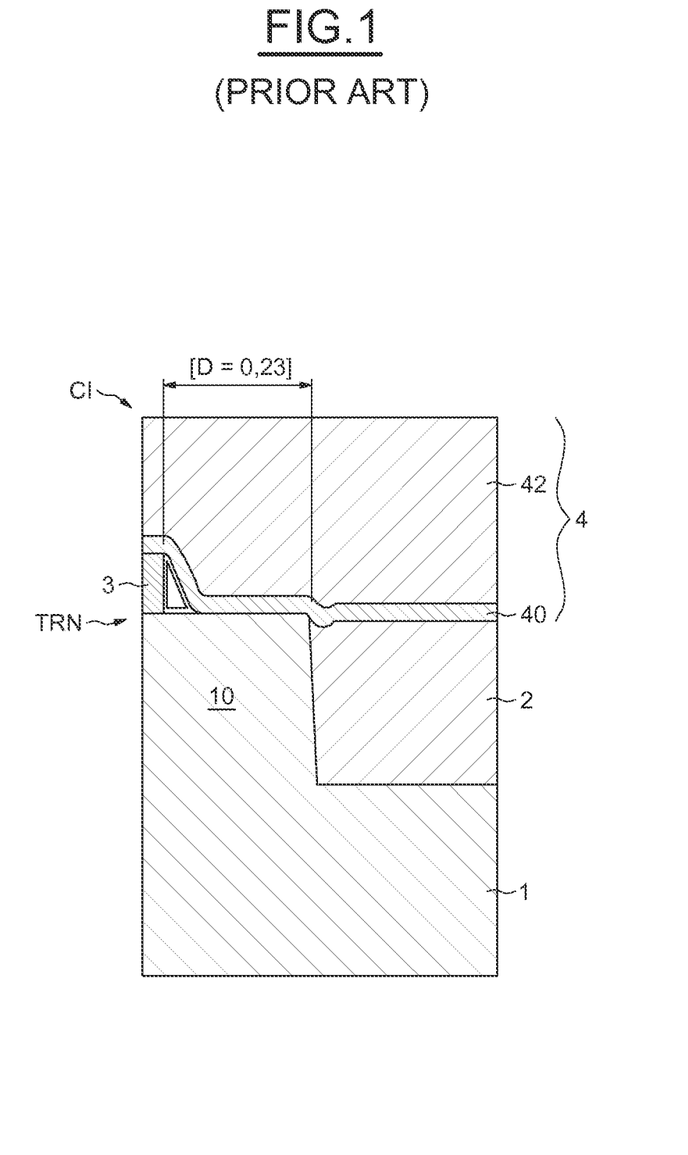
FIG. 1 schematically illustrates an NMOS transistor of the prior art.

In FIG. 1, the reference TRN denotes an NMOS transistor, the active region 10 of which is located within a semiconductor substrate 1, for example of p-doped silicon. The active region is surrounded by an insulating region 2, for example of the shallow trench type (STI: Shallow Trench Isolation).

The transistor TRN, forming part of an integrated circuit CI, conventionally comprises a gate region 3. Furthermore, the gate region 3, the active region 10 and the insulating region 2 are covered with an additional insulating region 4, conventionally comprising an insulating lower layer 40, for example of silicon nitride, also referred to by the person skilled in the art by the acronym CESL (Contact Etch Stop Layer). The additional insulating region 4 also comprises at least one other layer above the layer 40, for example at least one layer 42 of silicon dioxide.

For purposes of simplifying FIG. 1, the source and drain regions located in the active region and n-doped are not represented.

The transistor TRN is produced here in a 90 nanometer technology, and the distance D between the gate region 3 and the insulating region 2, that is to say the length of the source or drain region, is equal here to 0.23 micrometer because of the presence of a contact on this source or drain region.

When the component is a capacitor, this region 3 forms an electrode of the capacitor, and the distance D may be reduced to 0.15 micrometer in the absence of the contact.

The insulating region 2 is generally made of silicon dioxide. In view of the fact that the coefficient of thermal expansion of the active region 10 is greater than the coefficient of thermal expansion of the insulating region 2, at the end of the fabrication method, and particularly during the cooling, the silicon dioxide 2 contracts less than the silicon 10 of the active region, leading to an insulating region 2 in compression and consequently inducing compressive stresses in the active region 10.

Figure 2:
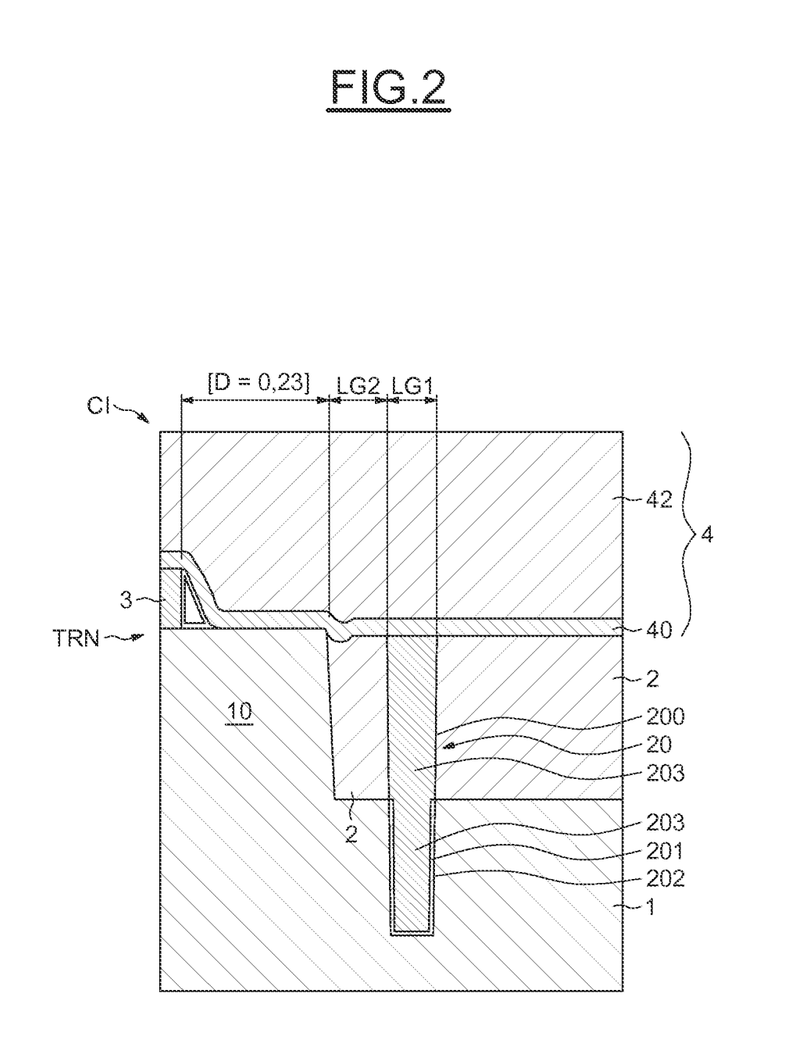
FIGS. 2 to 18 schematically illustrate various embodiments.
Figure 3:
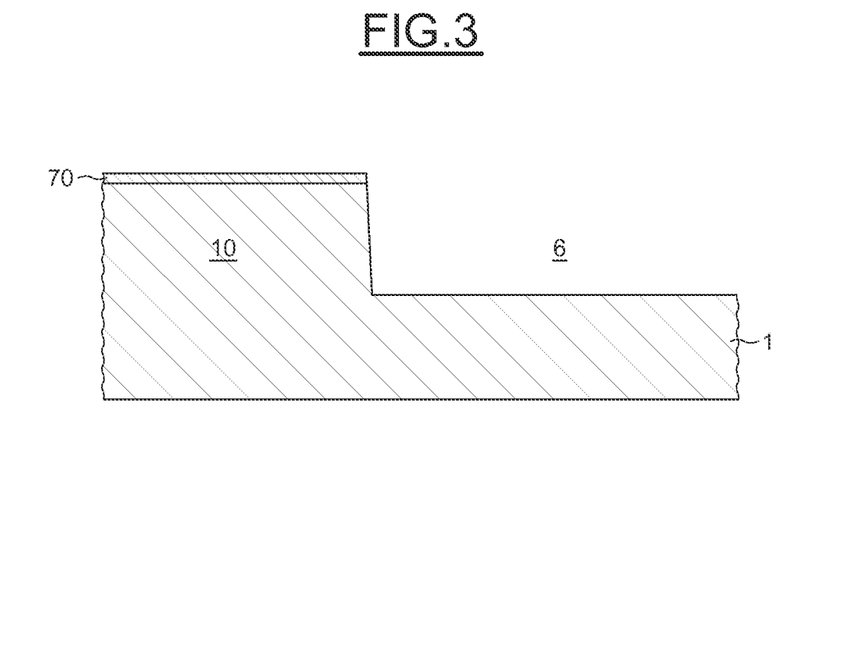

Compared with the transistor TRN of FIG. 1, the transistor TRN according to the embodiment illustrated in FIG. 2 comprises at least one electrically inactive trench 20, here having an upper part 200 located in the insulating region 2 and extended by a lower part 201 located in the underlying substrate 1.

Furthermore, in this example the internal walls of the lower part 201 of the trench are lined with an electrically insulating layer 202, for example of silicon dioxide.

The internal area of the trench produced in this way contains polycrystalline silicon, or polysilicon, 203.

The upper face of the electrically inactive trench 20 is located substantially at the same level as the upper face of the active region 10. This trench is electrically inactive because it is not electrically connected to any electrical potential.

This trench 20 therefore only has a mechanical function, allowing reduction of the compressive stresses in the active region 10. Specifically, in this exemplary embodiment, the polysilicon 202, which is initially deposited amorphously, recrystallizes during the cooling to become a material in tensile stress, which reduces the compressive stresses particularly in the insulating region 2, which consequently makes it possible to reduce the compressive stresses in the active region 10.

Although in the embodiment in FIG. 2 the trench 20 is extended into the underlying substrate, it would have been possible for the trench 20 to be located only within the insulating region 2, without extending into the underlying substrate. Furthermore, with such an embodiment a reduction of the compressive stresses by about 15% is obtained compared with the transistor of FIG. 1.

This being the case, the lower part of the trench 20, located in the underlying substrate, also contributes to reduction of the compressive stresses in the active region 10. Thus, the embodiment of FIG. 2 allows a 30% reduction of the compressive stresses in the active region compared with the transistor of FIG. 1.

Furthermore, the insulating layer 202 makes it possible to avoid direct contact between the silicon of the substrate and the polysilicon 203 of the trench, which avoids the occurrence of dislocations.

The width LG1 of the trench 20 is equal here to the critical dimension CD of the technology in question, in the case in point 0.11 micrometers. This critical dimension is the minimum dimension of a line of the active region.

The distance LG2 between the edge of the trench 20 and the edge of the active region 10 is equal here to a minimum distance defined by the design rules (DRM: Design Rules Manual) of the technology in question, in the case in point 0.05 micrometer for a 90 nanometer technology.

FIGS. 3 to 6 schematically illustrate the production of the insulating region 2 and of the electrically inactive trench 20 of the transistor TRN of FIG. 2.

Figure 4:
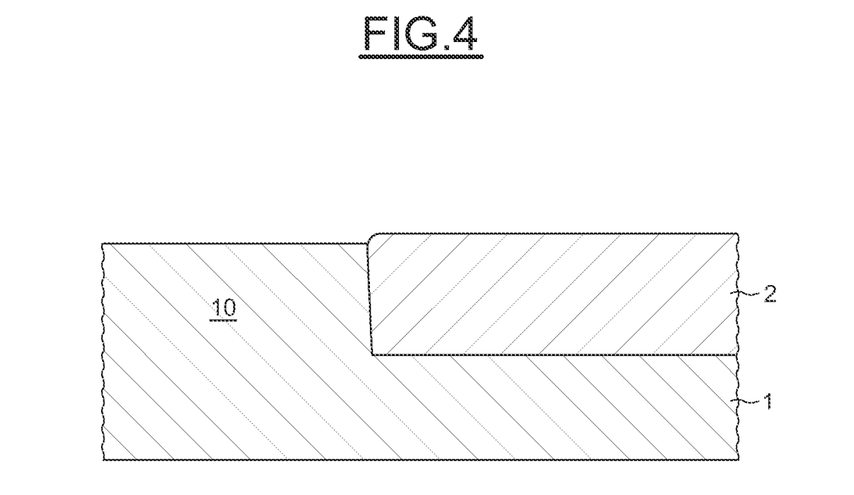

More precisely, after having deposited on the substrate 1 a bilayer 70 (silicon oxide/silicon nitride) surmounted by a layer of photosensitive resin, which is exposed through a mask referred to as an "active mask or active region mask", which will make it possible to determine the contours of the insulating region 2 and consequently those of the active region, after development of the resin the bilayer 70 and the substrate 1 are etched by using the remaining part of the resin as a hard mask, so as to obtain a trench 6 (FIG. 3) which will be filled with insulating material so as to form, after chemical-mechanical polishing and removal of the silicon nitride, the insulating region 2 (FIG. 4).

Figure 5:
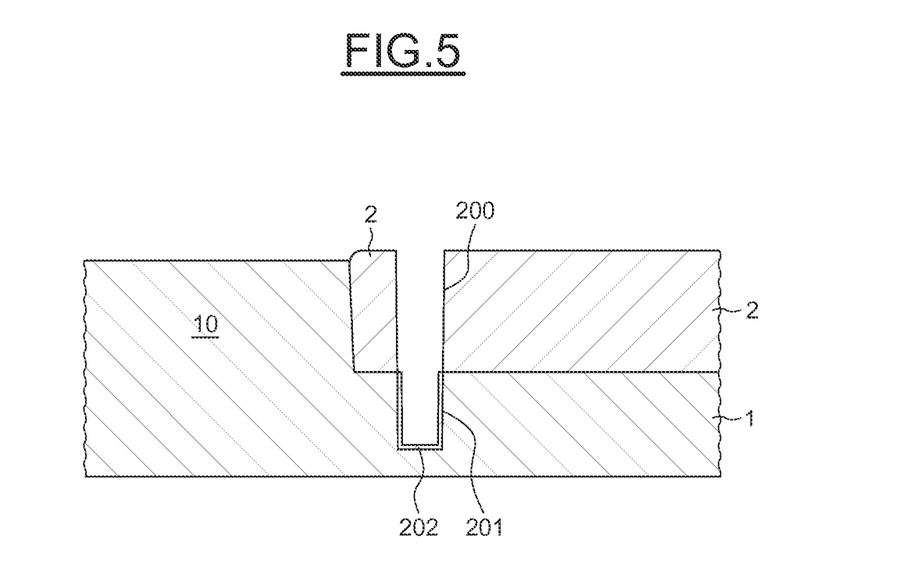

Then, as illustrated in FIG. 5, etching of a first trench is carried out so as to define the upper part 200 and the lower part 201, and reoxidation of the lower part 201 of this first trench is carried out so as to form the electrically insulating layer 202.

At this stage, a trench which is referred to here as the initial trench is thus obtained.

Figure 6:
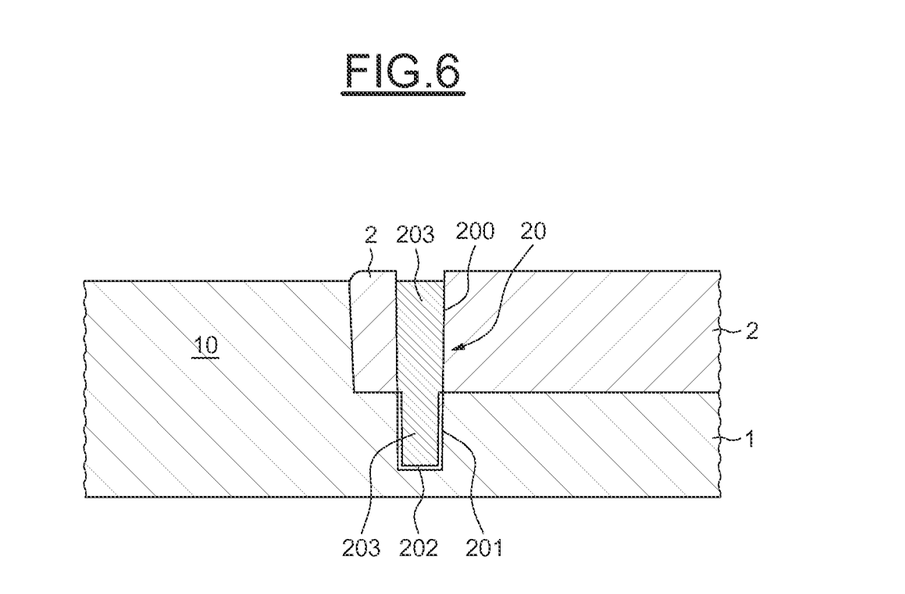

This initial trench is then filled with polysilicon deposited in the amorphous state at high temperature, this being converted into polycrystalline silicon during the cooling, then etched, for example by chemical-mechanical polishing or dry etching (FIG. 6).

Figure 7:
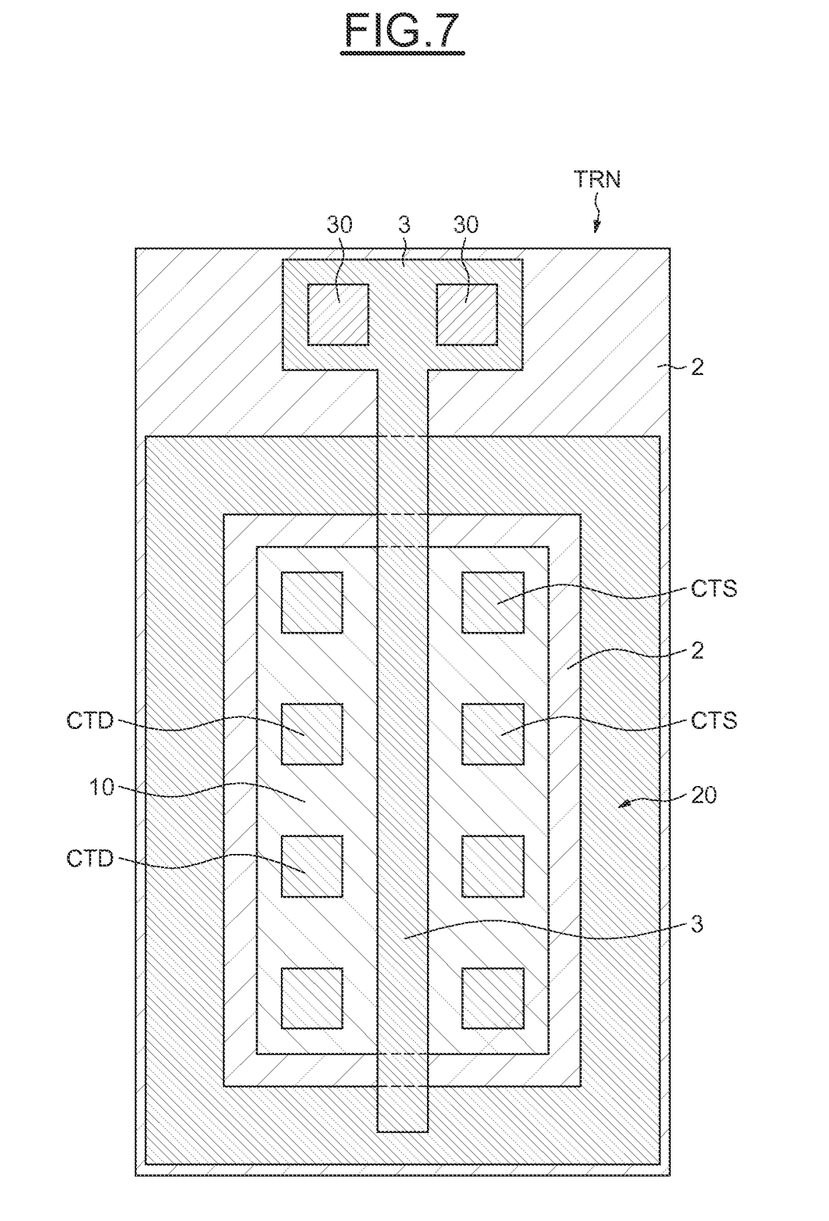

FIG. 7 is a schematic view from above of another embodiment of a transistor TRN. In this figure, the transistor TRN comprises a gate region 3 surmounting the transistor active region 10, which is limited by the insulating region 2. Gate contacts 30 are formed at one end of the gate region, while source contacts CTS and drain contacts CTD are formed on the source and drain regions of the transistor. Furthermore, it can be seen that it is possible, when the environment of the transistor TRN so allows, to arrange the electrically inactive trench 20 all around the active region 10. This allows even more effective reduction of the compressive stresses in the active region 10.

This being the case, depending on the environment of the transistor TRN, the electrically inactive trench 20 could surround the active region 10 only partially.

It should be noted here that, since the trench 20 is electrically inactive, it may readily be surmounted by the gate polysilicon 3 without the risk of creating a transistor. Furthermore, a stray capacitance possibly generated by this overlap would be very small.

Figure 8:
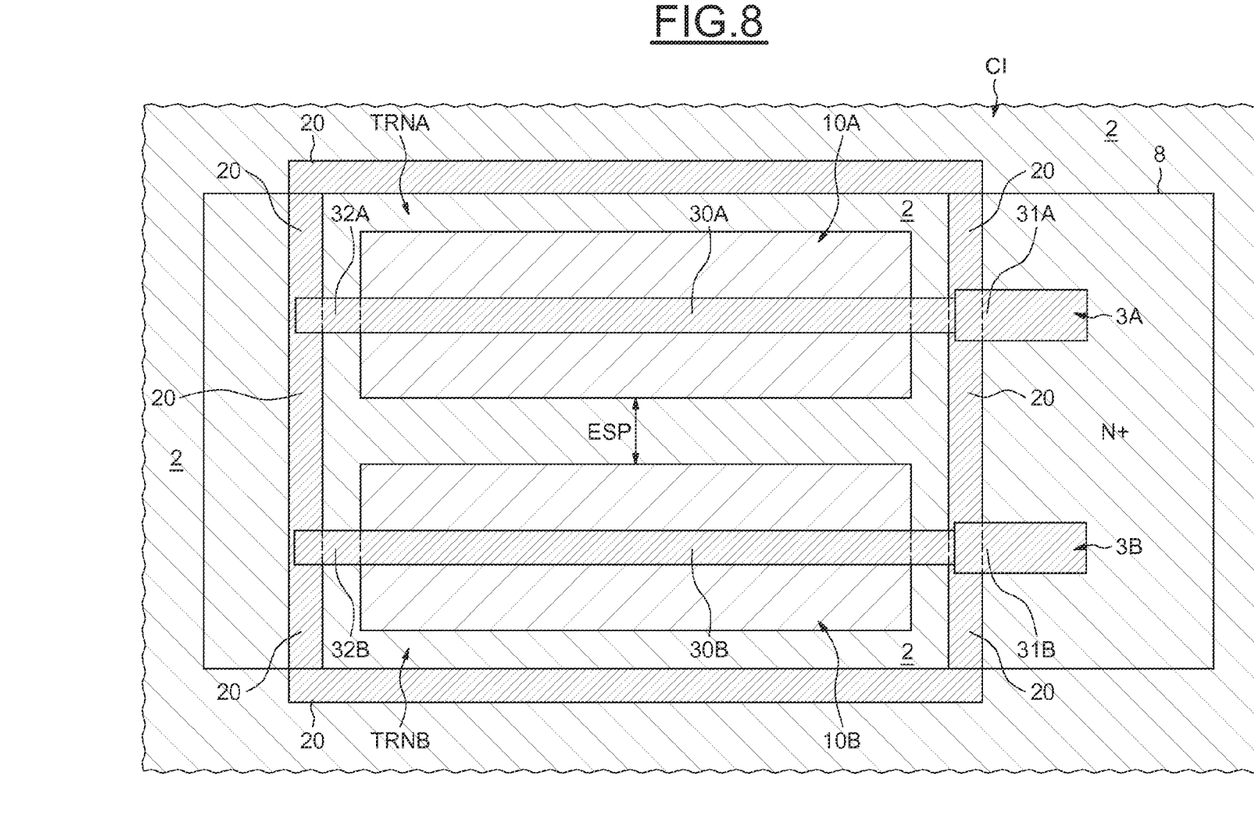

The transistor TRN may sometimes be located beside another transistor TRN, as is the case in FIG. 8.

The integrated circuit CI illustrated in FIG. 8 comprises two NMOS transistors TRNA, TRNB. The transistor TRNA comprises an active region 10A surrounded by the insulating region 2, and the transistor TRNB comprises the active region 10B, also surrounded by the insulating region 2.

The transistor TRNA comprises a gate region 3A formed, for example, by a line of polysilicon. This gate region 3A comprises one part 30A located above the active region 10A, one part 31A extending beyond a first end of the active region and allowing contact to be made on the gate region, and another part 32A extending beyond a second end of the active region.

The gate region 3B of the transistor TRNB has a similar structure to the gate region 3A. More precisely, it comprises a central part 30B located above the active region 10B, and two parts 31B and 32B extending beyond this active region 10B.

The zone 8 represents the n+ implantation zone of the two NMOS transistors. It can furthermore be seen that the integrated circuits CI comprises, around this group of two transistors TRNA and TRNB, an electrically inactive trench 20 formed within the insulating region 2.

This is because in this embodiment, the space ESP between the two active regions 10A and 10B is not sufficient to make it possible to surround the active region of each transistor with an electrically inactive trench 20. Specifically, this space must be at least equal to twice the minimum spacing LG2 plus the critical dimension LG1, i.e. 0.25 micrometer for a 90 nanometer technology.

Figure 9:
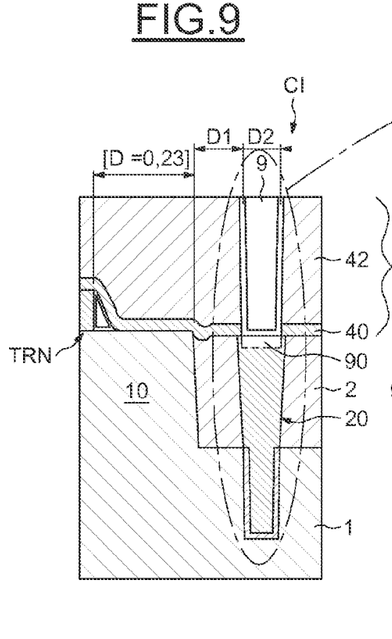
Figure 10:
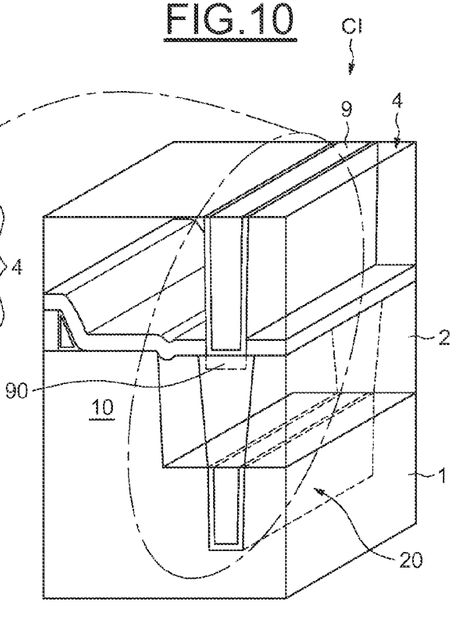

In the embodiments illustrated in FIGS. 9 and 10, the relaxation of the stresses in the active region 10 of the transistor TRN is obtained by a metal contact 9 extending through the additional insulating region 4 in order to optionally penetrate inside the trench 20 (part 90 in dashes in these figures).

This being the case, the Inventors have observed that even if the metal contact 9 extends only through the insulating region 4, and in particular the CESL layer 40, without penetrating into the trench 20, relaxation of the compressive stresses in the active region 10 of the transistor TRN is nevertheless obtained compared with the compressive stresses of the region 10 of the transistor TRN of FIG. 1.

Furthermore, this is true whether the layer 40 is a layer in compression or a layer in tension, because in the latter case the material used for the contact region 9 is generally a material which is itself in tension. Furthermore, the Inventors have observed that the combination of a layer 40 in tension through which a contact region extends, which is itself in tension, has also made it possible to increase the tension in the channel region, which makes it possible to increase the mobility of the electrons.

Such a metal contact 9 is produced in a similar way to the metal contacts intended to make contact with the source, drain and gate regions of the transistor in order to connect them to a metallization level of the interconnection part (BEOL: Back End Of Line) of the integrated circuit.

This being the case, this metal contact 9, the location of which is defined on the "contact" mask, and the geometry of which may be different from that of the conventional contacts intended to contact the source, drain and gate regions, is mechanically active for relaxation of the stresses but electrically inactive because neither of its ends is in contact with a potential.

This being the case, the use of metal contacts coming in contact with the electrically inactive trench 20, or even penetrating into this trench, is not always possible.

This is because the dimensional constraints to be complied with for the production of a metal contact in relation to the edge of the active region are more stringent than those governing the production of the trench 20.

Thus, in the 90 nanometer technology, for example, the minimum distance D1 between the contact region 9 and the edge of the active region is equal to 0.10 micrometers, which is twice as great as the length LG2 (FIG. 2) separating the edge of the trench 20 from the edge of the active region.

The minimum width D2 of a contact region 9 is for its part equal to 0.12 micrometers in the 90 nanometer technology, for example.

These dimensions D1 and D2, in particular, are used automatically in the computing tool for generating the "contact" mask in order to determine, as a function of the locations of the various active regions 10 and trenches 20, but also as a function of the distance in relation to a possible neighboring polysilicon region and/or the presence or absence of a metal line at an upper metallization level, the possible locations of the contact region or regions 9 which come in contact with or penetrate into these trenches, as well as the geometries and dimensions of the or these contact regions.

Furthermore, this is done automatically without intervention by the designer of the circuit, and in a way which is entirely transparent for him.

Figure 11:
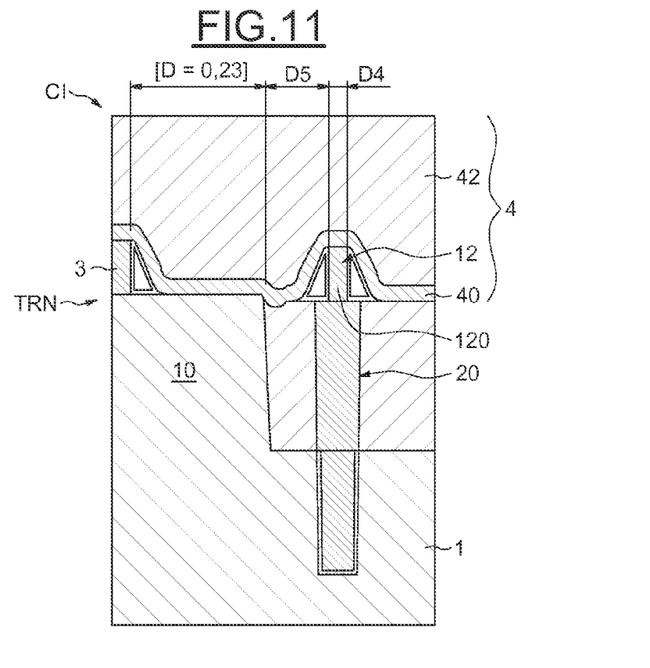

In the embodiment illustrated in FIG. 11, the insulating lower layer 40 is a layer in compressive stress. Furthermore, the relaxation of the stresses in the active region 10 of the transistor TRN is obtained by a protrusion 12 resting on the trench 20 and located under the insulating lower layer 40.

In other words, this protrusion locally raises the insulating lower layer 40, which makes it possible to accentuate the relaxation of the compressive stresses in the active region 10.

Figure 12:
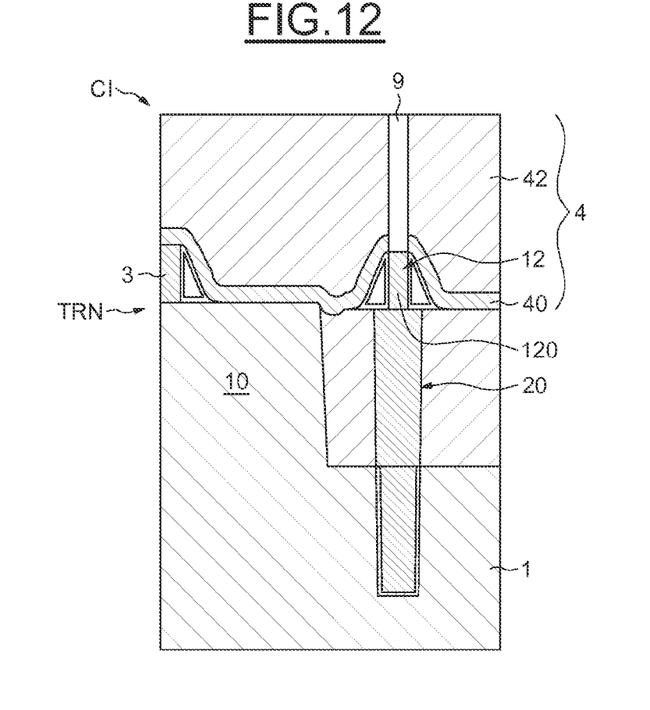

As illustrated in FIG. 12, when the component unfavorably sensitive to compressive stresses is an NMOS transistor TRN, this protrusion advantageously has a structure similar to that of the gate region 3 of the transistor. This protrusion then comprises, for example, polysilicon in its central part 120.

In the 90 nm technology, for example, the minimum width D4 of the central part of a protrusion 12 is equal to 0.1 micrometers, and the minimum distance D5 between a central part of a protrusion 12 and the edge of the active region is equal to 0.05 micrometers.

The production of the protrusion 12 is advantageously carried out simultaneously with the production of the gate region 3 and with production steps identical to those used for the production of this gate region.

More precisely, after having produced the central part of the gate region 3 and the central part 120 of the protrusion 12 by deposition and etching, these central parts are flanked with lateral insulating regions, or spacers. The additional insulating region 4 is then produced with the lower layer 40 in compression.

The location and the geometry of the polysilicon central part 120 of the protrusion 12 are defined on the "poly" mask used for defining the locations and geometries of the gate regions of the transistors.

The dimensions D4, D5 and D6 are used automatically in the computing tool for generating the "poly" mask in order to determine, as a function of the locations of the various active regions 10 and trenches 20, the possible locations of the protrusion or protrusions 12 as well as the geometries and dimensions of the or these protrusions.

Furthermore, here again, this is done automatically without intervention by the designer of the circuit, and in a way which is entirely transparent for him.

It is of course possible, if the environment so permits, to combine within an integrated circuit an electrically inactive trench 20, a protrusion 12 and a contact region 9, as illustrated in FIG. 12. More precisely, in this figure these three elements are stacked. Thus, the protrusion 12 is located above the electrically inactive trench 20 and is surmounted by the contact region 9.

Figure 13:
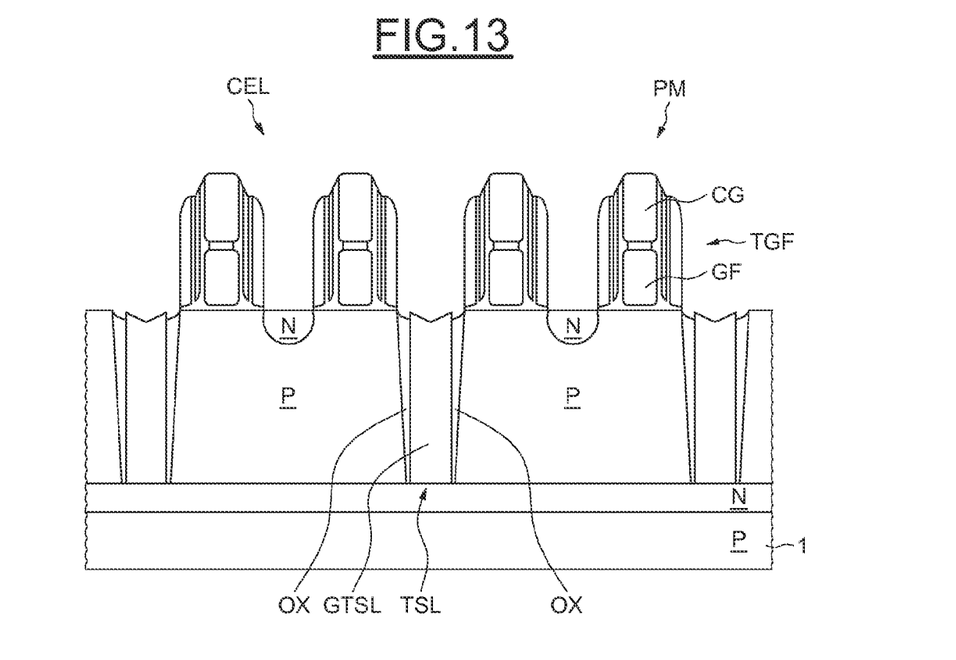

Reference is now made more particularly to FIGS. 13 to 18 in order to illustrate an application for an integrated circuit comprising a memory device, the memory plane PM of which has, as illustrated in FIG. 13, nonvolatile memory cells CEL and buried-gate selection transistors TSL.

More precisely, each memory cell CEL comprises a floating-gate transistor TGF produced in and on a p-type semiconductor body separated from an underlying p-type substrate by an n-type semiconductor layer. Conventionally, each floating-gate transistor comprises a floating gate GF, for example made of polysilicon, and a control gate CG.

Each selection transistor TSL making it possible to select a row of cells is an MOS transistor, the gate GTSL of which is a gate buried in the p-type body and electrically insulated from this body by a gate oxide OX, typically silicon dioxide. The n-type buried layer forms the source regions of the selection transistors TSL. It should be noted that the buried gate GTSL is common to the two adjacent selection transistors TSL, the two gate oxides OX of which are respectively located on the two sides of this buried gate.

Figure 14:
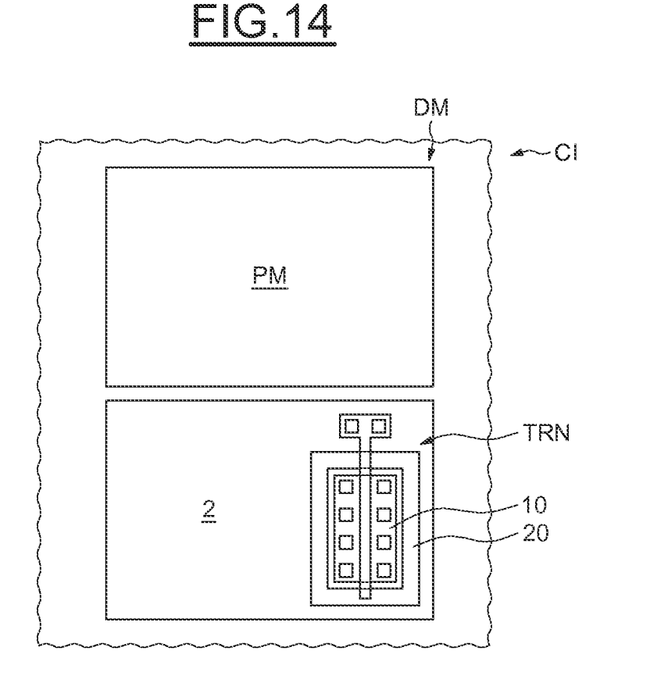

As is conventional in the art, and schematically illustrated in FIG. 14, the memory device DM integrated within the integrated circuit CI comprises, in addition to the memory plane PM formed by the matrix of memory cells CL, a control unit or logic comprising, in particular, line decoders and column decoders. All these elements of the control unit BLC comprise, in particular, NMOS transistors TRN.

Furthermore, while because of the density of the memory plane it is not conceivable to arrange electrically inactive trenches 20 inside the memory plane, but also around this memory plane so as to avoid edge effects, it is entirely advantageous as illustrated in FIG. 14 to associate with at least some of the NMOS transistors electrically inactive trenches 20 which may in certain cases surround at least some of these NMOS transistors TRN.

Figure 15:
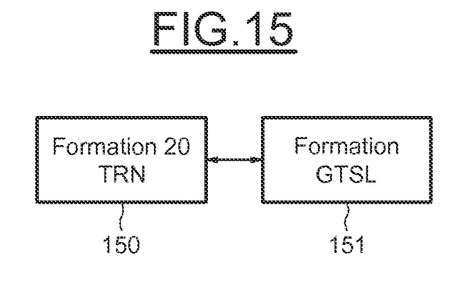

Furthermore, as illustrated very schematically in FIG. 15, the formation 150 of the electrically inactive trenches 20 of the transistors TRN is carried out simultaneously with the formation 151 of the buried gates GTSL of the selection transistors TSL of the memory plane. Specifically, the etching of the trenches intended to receive the buried gates of these transistors and the etching of the first trenches in the insulating region around the transistors TRN and in the underlying substrate are carried out simultaneously, and the definition of the locations of these first trenches is defined on the same mask as that making it possible to define the trenches intended to receive the buried gates. Furthermore, this is entirely transparent for the designer of the integrated circuit, because the locations of the first trenches intended to become the electrically inactive trenches 20 are defined within the insulating regions 2, and are in any case electrically inactive.

The depths of the first trenches and of those intended to receive the buried gates GTSL are substantially identical.

Furthermore, the oxidation of the internal walls of all these trenches leads on the one hand to formation of the gate oxide of the selection transistors, and on the other hand to formation of the insulating layer 202.

Lastly, all these trenches are filled with polysilicon.

Figure 16:
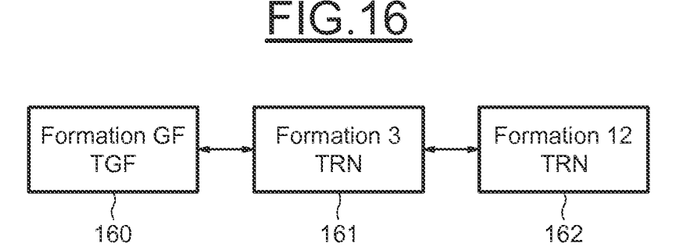
Figures 17, 18:
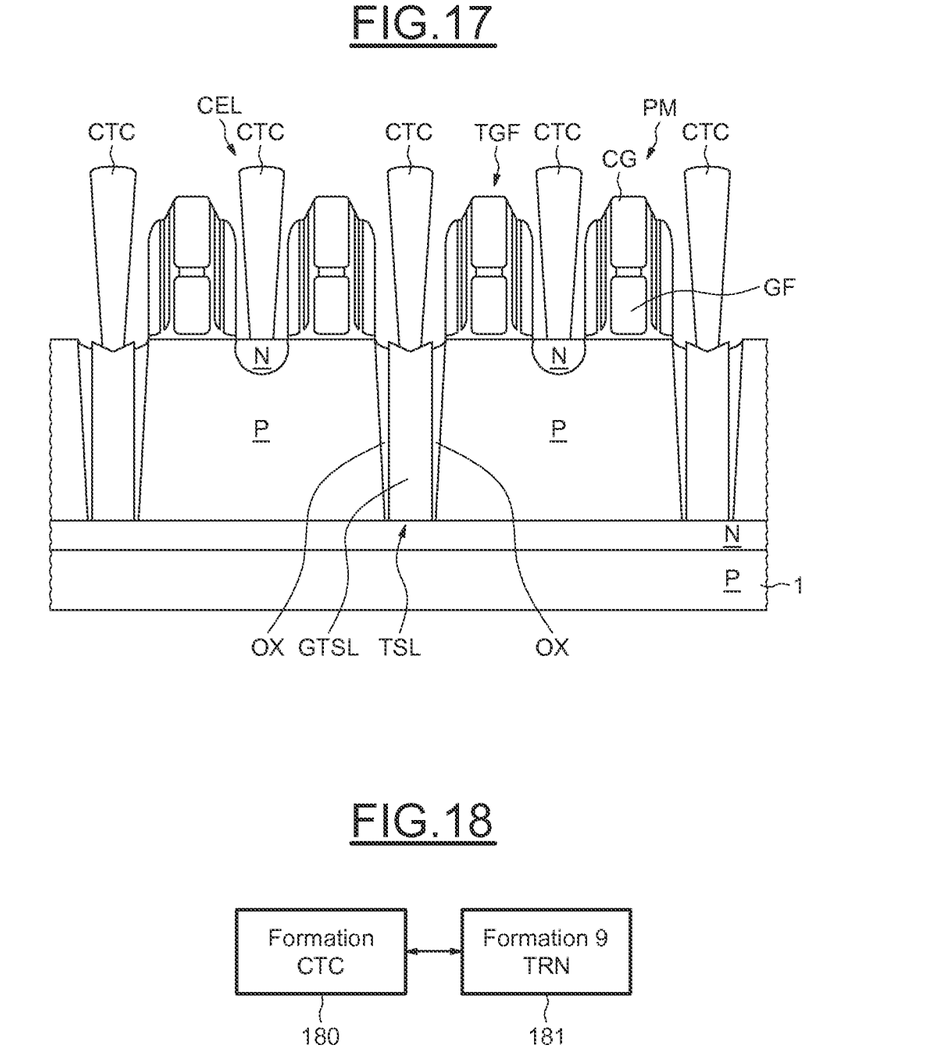

Furthermore, as illustrated in FIG. 16, the formation 160 of the floating gates GF of the floating-gate transistors TGF is carried out simultaneously with the formation 161 of the gate regions 3 of the transistors TRN, which is itself carried out simultaneously with the optional formation 162 of a protrusion 12 by using the "poly" mask. Lastly, as illustrated in FIG. 17, contacts CTC are made on various regions of the memory cells of the memory plane PM. Furthermore, by analogy with what has been described above, the formation 180 (FIG. 18) of these contacts CTC is advantageously carried out simultaneously with the optional formation 181 of the contact region 9 associated with the transistor TRN, by using the "contact" mask.

What is claimed is:

1. An integrated circuit, comprising:
   a semiconductor substrate;
   at least one component unfavorably sensitive to compressive stress which is arranged at least partially within an active region of the semiconductor substrate limited by an insulating region formed in the semiconductor substrate; and
   at least one electrically inactive trench located extending completely through the insulating region and into the semiconductor substrate and containing an internal area configured to reduce compressive stress in the active region;

wherein the at least one electrically inactive trench comprises:
an upper part located in the insulating region; and
a lower part extending from the upper part and located in the semiconductor substrate underneath the insulating region,
wherein said internal area is located in both the upper part and the lower part.

2. The integrated circuit according to claim 1, wherein the internal area contains polycrystalline silicon.

3. The integrated circuit according to claim 1, wherein the lower part of the trench comprises an electrically insulating layer arranged between the internal area and the semiconductor substrate.

4. The integrated circuit according to claim 1, wherein the trench surrounds the active region.

5. The integrated circuit according to claim 1, comprising a group of a plurality of components unfavorably sensitive to compressive stresses, which are respectively arranged at least partially within a group of a plurality of active regions of the semiconductor substrate, which are limited by the insulating region, and the at least one electrically inactive trench surrounds the group of active regions.

6. An integrated circuit, comprising:
a semiconductor substrate;
at least one component unfavorably sensitive to compressive stress which is arranged at least partially within an active region of the semiconductor substrate limited by an insulating region formed in the semiconductor substrate;
at least one electrically inactive trench located extending into the insulating region from a top surface of the insulating region and containing an internal area configured to reduce compressive stress in the active region, said internal area having a top surface coplanar with the top surface of the insulating region;
an additional insulating region comprising an insulating lower layer in compression and arranged above the component and the active region and in contact with the top surface of the insulating region; and
at least one electrically inactive protrusion arranged on the top surface of the internal area above at least a part of the trench and wherein the insulating lower layer in compression passes over the at least one electrically inactive protrusion.

7. The integrated circuit according to claim 6, wherein the protrusion comprises polycrystalline silicon.

8. The integrated circuit according to claim 6, further comprising an electrically inactive contact region extending through the additional insulating region and coming in contact at least with the upper face of the electrically inactive protrusion, the at least one contact region being formed by at least one material different from the materials forming the insulating region and the additional insulating region.

9. An integrated circuit, comprising:
a semiconductor substrate;
at least one component unfavorably sensitive to compressive stress which is arranged at least partially within an active region of the semiconductor substrate limited by an insulating region formed in the semiconductor substrate;
at least one electrically inactive trench located in the insulating region and containing an internal area configured to reduce compressive stress in the active region, said internal area having a top surface coplanar with the top surface of the insulating region;
an additional insulating region arranged above the component, the active region and the insulating region; and
at least one contact region extending through the additional insulating region and coming in contact at least with the top surface of the internal area within the trench, the at least one contact region being formed by at least one material different from the materials forming the insulating region and the additional insulating region.

10. The integrated circuit according to claim 9, wherein the contact region comprises a metal.

11. The integrated circuit according to claim 9, wherein the contact region penetrates into the top surface of the internal area.

12. The integrated circuit according to claim 9, wherein the at least one component is an NMOS transistor.

13. The integrated circuit according to claim 6, wherein the electrically inactive protrusion has a structure similar to that of a gate region of the transistor.

14. The integrated circuit according to claim 13, wherein the gate region of the transistor has a part extending above the insulating region and is spaced apart from the electrically inactive protrusion.

15. An integrated circuit, comprising:
a semiconductor substrate;
at least one component unfavorably sensitive to compressive stress which is arranged at least partially within an active region of the semiconductor substrate limited by an insulating region formed in the semiconductor substrate;
at least one electrically inactive trench located extending completely through the insulating region and into the semiconductor substrate and containing an internal area configured to reduce compressive stress in the active region;
a memory device comprising a memory plane having non-volatile memory cells and selection transistors with buried gates, as well as a control unit of the memory plane comprising NMOS transistors forming the components unfavorably sensitive to compressive stresses, the at least one electrically inactive trench being located in at least the insulating region limiting the active region of at least one of the NMOS transistors of the control unit and having a depth substantially equal to that of the buried gates.

* * * * *